US006946932B2

(12) United States Patent
Takagi et al.

(10) Patent No.: US 6,946,932 B2
(45) Date of Patent: Sep. 20, 2005

(54) SURFACE ACOUSTIC WAVE RESONATOR WITH AN INTERDIGITAL TRANSDUCER DIVIDED INTO REGIONS HAVING A DIFFERENT FIXED PITCH

(75) Inventors: Michiaki Takagi, Tatuno-machi (JP); Yoshio Maeda, Fujimi-machi (JP); Takashi Yamazaki, Minowa-machi (JP); Keigo Iizawa, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/679,480

(22) Filed: Oct. 7, 2003

(65) Prior Publication Data

US 2004/0251989 A1 Dec. 16, 2004

(30) Foreign Application Priority Data

Oct. 16, 2002 (JP) ....................................... 2002-301762
Jun. 17, 2003 (JP) ....................................... 2003-172107

(51) Int. Cl.[7] .............................. H03H 9/25; H03H 9/64
(52) U.S. Cl. ................... 333/195; 333/196; 310/131 B; 310/313 D
(58) Field of Search ................................ 333/193–196; 310/313 B, 313 D

(56) References Cited

U.S. PATENT DOCUMENTS

| 5,568,001 A | 10/1996 | Davenport .............. 310/313 R |
| 5,895,996 A | 4/1999 | Takagi et al. ........... 310/313 R |
| 6,160,339 A * | 12/2000 | Takagi et al. ........... 310/313 D |
| 6,335,667 B1 | 1/2002 | Takagi et al. ............... 333/195 |
| 6,420,946 B1 * | 7/2002 | Bauer et al. ................ 333/193 |
| 6,583,691 B2 * | 6/2003 | Takamine ................... 333/195 |

FOREIGN PATENT DOCUMENTS

| JP | A 57-73513 | 5/1982 |
| JP | A 10-335966 | 12/1998 |

OTHER PUBLICATIONS

Y. Suzuki et al.; "Energy–Trapping Surface Acoustic Wave Resonators", Technical Report of the IEICE US87–36, pp 9–16, Sep. 1987, w/partial transl.

* cited by examiner

Primary Examiner—Barbara Summons
(74) Attorney, Agent, or Firm—Oliff & Berridge, PLC

(57) ABSTRACT

In a substrate in which a reflection coefficient γ of a surface acoustic wave per electrode is small, the invention obtains a Q value or a CI value level, which is equivalent to or higher than that of a related art product, at a device size which is equivalent to the related art product which addresses the problem that the size of a surface acoustic wave resonator becomes larger. A surface acoustic wave resonator includes one interdigital transducer to excite a surface acoustic wave in a propagation direction x on a piezoelectric plate and a pair of reflectors arranged on both sides thereof in the propagation direction. The interdigital transducer is divided into three regions. The electrode fingers of the interdigital transducer of each region are formed at a fixed pitch which differs within 2%. The surface acoustic wave resonator possesses a single peak response. The form in which a vibration displacement envelope amplitude in the interdigital transducer region is normalized is a form which takes a maximum value 1 at the center position, which smoothly takes a value in a range of 0.33 to 0.53 at a position ¼ from both ends, and which smoothly takes a value in a range of 0.048 to 0.177 at positions at both ends.

5 Claims, 10 Drawing Sheets

100, 101 ENVELOPE AMPLITUDE OF VIBRATION DISPLACEMENT

SURFACE ACOUSTIC WAVE RESONATOR WITH AN INTERDIGITAL TRANSDUCER DIVIDED INTO REGIONS HAVING A DIFFERENT FIXED PITCH

BACKGROUND OF THE INVENTION

1. Field of Invention

The present invention relates to a new type of so-called energy-trapping-type surface acoustic wave resonator (hereinafter "SAW resonator"), formed on a piezoelectric plate, such as a quartz crystal, in which vibration energy is greatly concentrated in the center of the resonator so as to increase the Q value and reduce the CI value by using a Rayleigh-type or STW (surface Transverse wave) type surface acoustic wave.

2. Description of Related Art

A related art SAW resonator, formed by using a quartz-crystal ST-cut substrate (an example of a piezoelectric plate) having piezoelectricity, can be used as an oscillation device of a quartz-crystal oscillator for data transmission in various high-speed network systems because the frequency-temperature characteristics thereof have a zero temperature coefficient and have excellent accuracy. This is advantageous in that a signal without jitter and whose phase noise is reduced can be obtained with high accuracy and at a low cost.

However, in the related art, the signal transmission speed of network systems has increased up to the GHz band, and a demand exists for higher-accuracy quartz-crystal oscillators. In connection with the above, a related art SAW resonator disclosed in Japanese Patent Application Publication No. 57-73513 uses a rotated ST-cut quartz-crystal plate, and approximately half of frequency-temperature characteristics (accuracy ±50 ppm) is obtained with respect to the accuracy ±100 ppm (in the range of 0 to 70° C.) of the above-described ST cut plate. The above-mentioned substrate uses a Rayleigh-type surface acoustic wave.

Regarding such a rotated ST-cut quartz-crystal plate (hereinafter "R-ST substrate" from "rotated ST cut substrate"), the orientations thereof are shown in FIG. 13. In FIG. 13, reference numeral 1302 denotes the electrical axis X, which is a fundamental axis of a quartz crystal, reference numeral 1303 denotes the mechanical axis Y, and reference numeral 1304 denotes the optical axis Z. For the R-ST substrate, in a substrate 1300 such that a Y plate indicated by 1301 is rotated by θ degrees (in particular, θ=31 to 42 degrees, at which a zero temperature coefficient is obtained) about the electrical axis X, a rotational angle Ψ=±(40 to 46) degrees within the plane from the electrical axis X (=y axis of the device) in the substrate (1300 and 1307 are the same) is the phase propagation orientation (X'=the x axis of the device) of the surface acoustic wave used.

A SAW resonator 1306 using a R-ST substrate is formed along the x axis, as shown in FIG. 5 (described below). An interdigital transducer (hereinafter "IDT"), in which electrode fingers of many parallel conductors made of, for example, aluminum metal are arranged periodically, is formed, and a pair of reflectors are formed by arranging many electrode conductors in a strip shape in parallel and periodically, thereby forming a one-port-type SAW resonator.

More specifically, for example, in a related art SAW resonator in a related art ST cut plate (θ=31 to 42 degrees, and the phase propagation direction of the surface acoustic wave is the electrical axis (X axis)), as an essential point when the IDT is formed, when M pairs are formed by assuming a positive electrode and a negative electrode to be one pair, after the total reflection coefficient Γ of all electrode fingers of the IDT is defined as shown in the following equation (1), if Γ is set such that 10>Γ>0.8, a so-called energy-trapping-type SAW resonator discussed in Technical Report of the IEICE US87-36, pp 9–16 (1987.9), in which the vibration energy is concentrated in the center of the resonator, can be realized.

[Equation 1]

$$\Gamma = 4MbH/\lambda \qquad (1)$$

where M is the number of pairs in the IDT, b is the reflection coefficient rate of the surface acoustic wave per electrode, H is the film thickness of the conductor, and λ is the wavelength of the surface acoustic wave used.

For example, in the case of the IDT formed of the above-mentioned aluminum conductor in the ST-cut quartz-crystal plate, if M=80 pairs with b=0.255 and H/λ=0.03 (3%), a related art one-port-type SAW resonator having satisfactory Q and CI characteristics can be formed. At this time, Γ is approximately 2.448 degrees. the generally called reflection coefficient γ per electrode is γ=b(H/λ)=Γ/(4M)=0.00765 (0.76%) on the basis of equation (1) described above in the case of this ST-cut quartz-crystal plate.

When the state of the vibration displacement of the energy-trapping-type surface acoustic wave resonator is calculated by a related art calculation technique, it is found that the vibration displacement is in the state shown in FIG. 2. The vibration displacement refers to an envelope amplitude U(x) such that the maximum values of the vibration displacements which steadily vibrate periodically with time are connected (201 in FIG. 2). In FIG. 2, the horizontal axis shows the position coordinate of the center position (node) of the line width formed by one electrode of the SAW resonator formed of two reflectors on the two sides and the IDT. Regarding the vertical axis, the left side shows the relative value of U(x) and the right side shows the value of N(x)=U(x)/Umax, that is, the U(x) normalized by Umax=3.3, which is the maximum value of U(x). The coordinate from 0 to 1, shown in the upper portion of FIG. 2, is a coordinate value in which the position coordinate of the IDT is normalized across the total length of the IDT, with one of the ends being set at 0 and the other end being set at 1. The normalized amplitude N(x) in a related art SAW resonator is a smooth function in the form of a cosine function which takes N(x)=1 at ½ (the center position of the IDT region) of the total length, which takes 0.78 at ¼ and ¾, and which takes a value of 0.30 at both ends 0 and 1 of the IDT. The form of this function is called a "standard-type" by setting this function as NO(x) for later discussion.

Idea-related analysis results in which the degree of energy concentration at the center is increased more than NO(x) are disclosed in Japanese Patent Application Publication No. 10-335966, which is a document of the inventors of the present invention. However, in that publication, those analysis results are not yet described as a detailed and practical specific example in which they are quantized.

SUMMARY OF THE INVENTION

However, even if the above-described related art technology is used and the same configuration of the SAW resonator is taken, in the SAW resonator using the R-ST substrate, which is the subject of the present application, there are problems in that a high Q value equivalent to that of the related art technology and an appropriately low CI value (equivalent series resistance R1) when being used in a quartz-crystal oscillator are not obtained.

The reason for this is that, since the reflection coefficient γ in the R-ST substrate is as small as approximately half with respect to a Rayleigh wave (a combination of a longitudinal wave and a transverse wave) used in the ST cut plate, in order to maintain Γ at the same value, approximately twice the number of pairs M in the IDTs and the number of conductors N of the reflector are required. Therefore, at the same device size, the Q value is decreased, and the CI value is increased, and thus it becomes clear that miniaturization is difficult, which is a problem.

Accordingly, the present invention addresses or solves the above and/or other such problems by further developing the technique disclosed in Japanese Patent Application Publication No. 10-335966, for example, which is a document of the present inventors.

The present invention uses an R-ST substrate, to form a SAW resonator by using a quartz-crystal substrate having excellent frequency-temperature characteristics and having an excellent material Q value, realizes a small SAW resonator having a high Q value by using the above, and provides a SAW resonator and a voltage-controlled SAW oscillator, which are clock signal sources with low jitter and with low phase noise, using the above, in the high-speed wired communication market for Gigabit systems.

The present invention provides a surface acoustic wave including one interdigital transducer to excite a surface acoustic wave in a propagation direction x on a piezoelectric plate, and a pair of reflectors arranged on both sides in the propagation direction.

The interdigital transducer is divided into three regions. The electrode fingers of the interdigital transducer of each region are formed at a fixed pitch which varies within 2%. The surface acoustic wave resonator processes a single peak response.

The form in which a vibration displacement envelope amplitude in the interdigital transducer region is normalized is a form which takes a maximum value 1 at the center position, which smoothly takes a value in a range of 0.33 to 0.53 at a position of ¼ from both ends, and at positions at both ends, and which smoothly takes a value in a range of 0.048 to 0.177.

According to the above-described configuration, the displacement amplitude at positions at both ends of the IDT is decreased from 0.177/0.30=0.59 (approximately ½) to 0.048/0.30=0.16 (approximately ⅙) with respect to the related art standard-type displacement N0(x), and the degree of concentration of energy is increased. As a result, in a case where a reflector which is formed of the same number N and which causes the amplitude to be reduced to 1/R is used, the surface acoustic wave which leaks outside the SAW resonator from the end portions of the reflector is reduced from approximately ½ to ⅙ in comparison with the related art case, and the Q value of the SAW resonator is theoretically squared conversion of the amplitude and can be increased from 4 times to 36 times. Furthermore, the equivalent series resistance R1 can be reduced from ¼ to 1/36 on the basis of the relation $R1 = \omega L1/Q$. If the Q value of the SAW resonator is to be maintained the same, the number of electrode conductors of the reflector can be reduced correspondingly and the dimensions can be decreased. In practice, since there are various causes for energy loss of the SAW resonator, there are advantages in that R1 becomes approximately ½, the Q value becomes double, and the device size is decreased by 20 to 30%.

In the surface acoustic wave resonator of the present invention, regarding the array pitch of the interdigital transducer which is divided into three regions, the magnitude of the dimensions of the array pitch PTs of the interdigital transducer arranged on both sides, the array pitch PTc of the interdigital transducer arranged in the center, and the array pitch PR of the reflectors is set to satisfy the relation PR>PTs>PTc, the ratio PTc/PTs is in the range 0.985 to 0.996, and PR/PTs is in the range 1.0 to 1.01.

The number of pairs in the interdigital transducer arranged in the center is denoted as Mc, and Mc/M, which is the ratio to the total number of pairs M, is in the range 0.1 to 0.6.

With the above-described formation range, when the piezoelectric plate is a related art quartz-crystal ST cut plate, the Q value and R1 of the surface acoustic wave resonator formed on the rotated ST-cut quartz-crystal plate (R-ST substrate), in which the quartz-crystal rotated Y plate is rotated in a counterclockwise direction about the electrical axis (X axis) and the propagation direction of the surface acoustic wave is rotated in-plane from the electrical axis (X axis), can be realized at the most appropriate level.

In the surface acoustic wave resonator of the present invention, as specific formation conditions for having a form in which the vibration displacement envelope amplitude is normalized, the interdigital transducer and the reflectors are formed of aluminum metal, the interdigital transducer is formed of M pairs by assuming positive and negative electrodes to be one pair, the reflectors are formed of N electrode conductors, the total M+N is in the range 180 to 250, the number of pairs M of the interdigital transducer is in the range 95 to 140, the reflection coefficient γ of the surface acoustic wave per electrode is in the range 0.005 to 0.015, the total reflection coefficient Γ possessed by the entire interdigital transducer is 1.8>Γ>0.25, the closest distance between parallel conductors between the reflectors and the interdigital transducer is formed by a space from among the line and the space possessed by one pitch of the interdigital transducer, the dimensions of the array pitch PTs of the interdigital transducer arranged on both sides, the array pitch PTc of the interdigital transducer arranged in the center, and the array pitch PR of the reflector are set to satisfy the relation PR>PTs>PTc, the ratio PTc/PTs is in the range 0.985 to 0.996, PR/PTs is in the range 1.0 to 1.01, and Mc/M, which is a ratio of the number of pairs Mc in the interdigital transducer arranged in the center to the total number of pairs M, is in the range 0.1 to 0.6.

With the above-described formation range, in particular, the frequency-temperature characteristics can be enhanced to ½ of the related art case. There are advantages in that the Q value and R1 of the surface acoustic wave resonator formed on a rotated ST-cut quartz-crystal plate (R-ST substrate), which is a piezoelectric plate whose reflection coefficient γ is as small as approximately half (0.005 to 0.015), can be set at the most appropriate level and miniaturization can be realized.

In the surface acoustic wave resonator of the present invention, as a condition for the piezoelectric plate having a form in which the vibration displacement envelope amplitude is normalized, a rotated ST-cut quartz-crystal plate is used in which a quartz-crystal rotated Y plate is rotated by a rotational angle θ=31 to 42 degrees in a counterclockwise direction about the electrical axis (X axis) and in which the propagation direction x of the surface acoustic wave is rotated in-plane in a range of 40 to 46 degrees from the electrical axis (X axis).

With the above-described configuration, by applying the method of the present invention, the frequency-temperature characteristics of the surface acoustic wave resonator can be enhanced to approximately half (accuracy ±20 ppm) of the related art case (½) in a range of 0 to 70° C. without deteriorating the characteristics in comparison with the related art case, and thus there are advantages in that a quartz-crystal SAW resonator whose accuracy is higher than in the related art case, which is ±50ppm as a whole, can be realized.

In the surface acoustic wave resonator of the present invention, the above-described M is 100±5, N is in the range 80 to 140, the ratio PTc/PTs is in the range 0.995±0.001, and Mc/M, which is the ratio to the total number of pairs M, is 0.5±0.05.

With the above-described configuration, because of a high Q value (two times as high as in the related art case) of approximately 12000 and since spurious resonance does not exist within the region 1202 (FIG. 12) of the lower side 10000 ppm of the resonance frequency of the main vibration mode, a frequency hopping phenomenon does not occur within this range. Therefore, a SAW-VCSO capable of varying the frequency over a wide bandwidth can be realized.

BRIEF DESCRIPTION OF THE DRAWINGS

FIG. 3A shows a resonance frequency of a related art SAW resonator, and FIG. 3B shows a SAW resonator of the present invention;

DETAILED DESCRIPTION OF PREFERRED EMBODIMENTS

A one-port-type SAW resonator is formed in such a manner that, after the above-described ST-cut or rotated ST-cut plate (R-ST substrate) is cut out from a piezoelectric material made of quartz crystal (see FIG. 13) and the surface thereof is mirror-polished, an IDT is formed in which electrode fingers of many parallel conductors formed of, for example, aluminum metal, are arranged periodically in such a manner as to be at right angles to the phase propagation direction x of a Rayleigh-type or STW-type surface acoustic wave, and furthermore, a pair of reflectors are formed by periodically arranging many electrode conductors in strips on both sides of the IDT.

An exemplary embodiment of a one-port-type SAW resonator of the present invention is described below. First, to facilitate understanding, after the configuration of a specific exemplary embodiment is described with reference to FIG. 5, the form of the vibration displacement which specifies the basis of the present invention, obtained by using the configuration of FIG. 5 as an example, is clarified, and the characteristics possessed by the surface acoustic wave resonator of the present invention is described in detail below with reference to FIGS. 3A, 3B, 4, 6, 7, 8, 9, 10, 11, and 12.

(Exemplary Embodiments)

Figure 5:
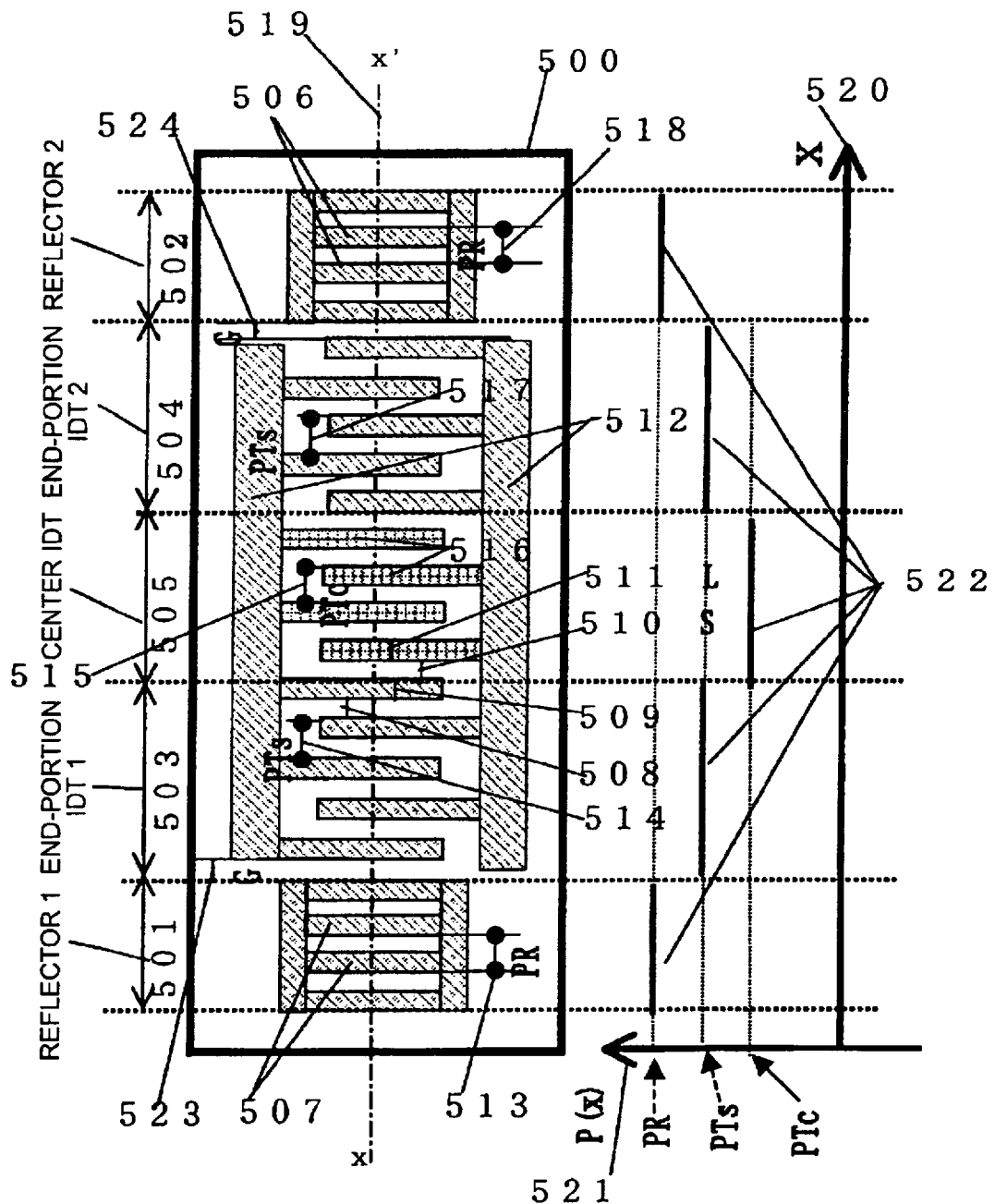
FIG. 5 is a plan view of an electrode pattern possessed by an exemplary embodiment of the SAW resonator of the present invention.

FIG. 5 shows an electrode pattern formed on a piezoelectric plate obtained in the orientation substrate of FIG. 13 described above with regard to an exemplary embodiment of a surface acoustic wave resonator (hereinafter "this device").

Figure 13:
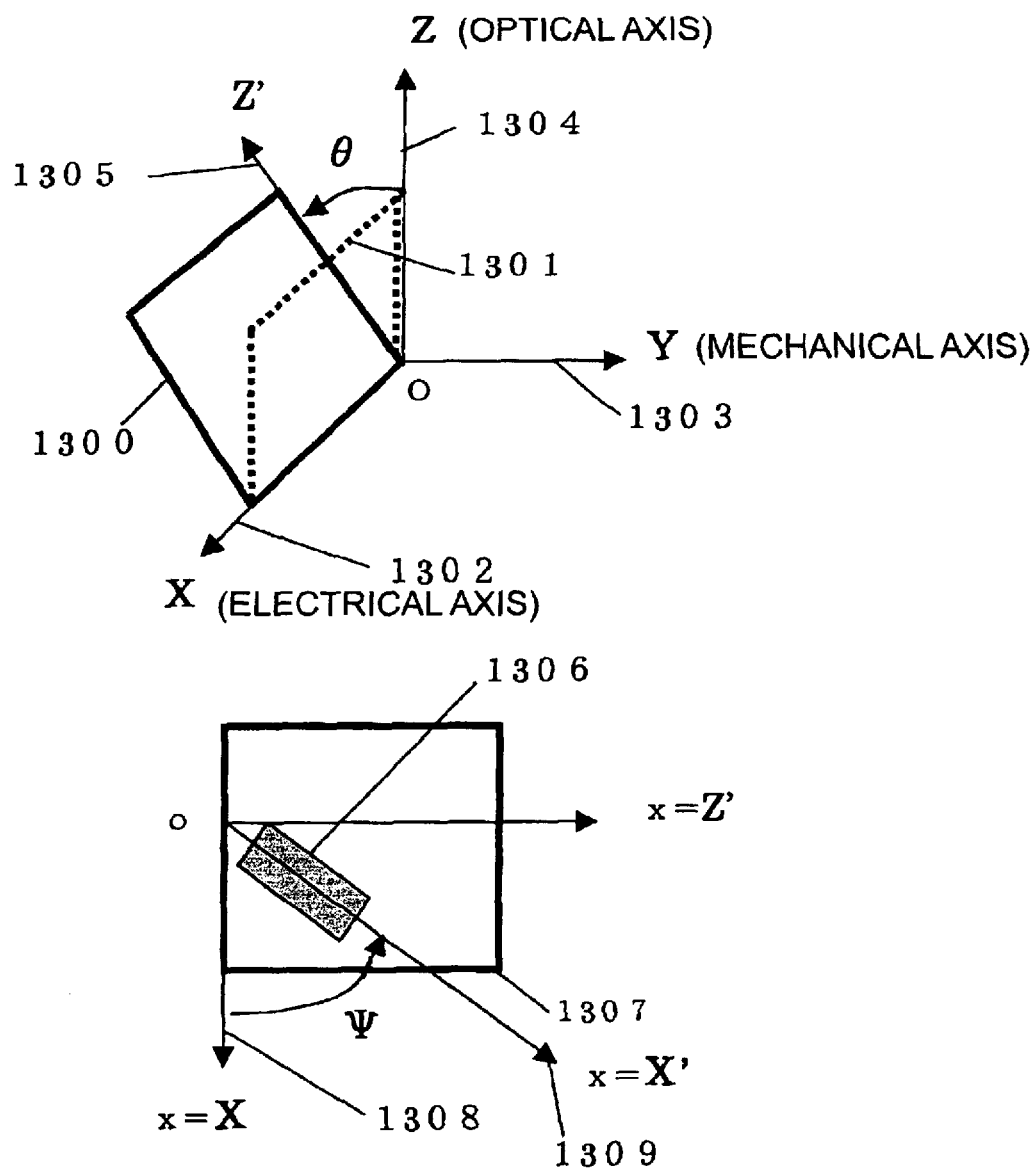
FIG. 13 is a schematic of a piezoelectric plate used in FIGS. 1 and 5 of the present invention.

In FIG. 5, reference numeral 500 denotes a piezoelectric plate made of the orientation substrate of FIG. 13 described above, and reference numeral 519 on the piezoelectric plate denotes the x axis, which is the propagation direction of the surface acoustic wave used in this device. Regarding each part forming the whole electrode pattern, which is formed in regions divided by horizontal broken lines, a bottommost section 501 and a topmost section 502 are a reflector 1 and a reflector 2, respectively. Reference numerals 503, 504, and 505 together form an interdigital transducer (hereinafter "IDT"). For the IDT which is divided into three portions, 503 will be called an "end portion IDT 1", 504 is referred to as an "end portion IDT 2 ", and 505 is referred to as a "center IDT 3". Reference numerals 506, 507, etc., in the reflector 1 and the reflector 2 denote groups of electrode conductor strips made of aluminum metal, which play the role of reflecting the surface acoustic wave by a perturbation effect. Reference numeral 516, etc., in the IDT denotes positive and negative electrode fingers, and a total of M pairs are formed assuming positive and negative electrode fingers as one pair, Mc pairs are formed in the center IDT, and (M−Mc)/2 pairs are formed in each of the end portion IDT 1 and the end portion IDT 2 . Reference numeral 512, which connects the electrode finger group 516 of the above-mentioned three IDTs 503, 504, and 505, in such a manner as to be longitudinally integrated is called a "bus bar".

PR of symbols 513 and 518 in FIG. 5 is the array pitch of conductor strips of the reflector 1 and the reflector 2, and is the sum of the width LR of the conductor strip and the spacing SR between conductor strips, that is, PR=LR+SR. The dimensions 509 and 511, and 508 and 510 are the line width LT of the electrode finger in the IDT and the spacing (space) ST between them, respectively. Furthermore, the array pitch PTs specified by 514 and 517 is the array pitch of the end portion IDT 1 and the end portion IDT 2 , and is the sum of the line width LT of the electrode finger and the spacing (space) ST between the electrode fingers.

PTc of 515 is the array pitch of the center IDT. The dimensions G of 523 and 524 are set to be equal to the space ST between the end portion IDT 1 and the end portion IDT 2.

The proper setting of the dimensional values represented by the symbols PR, PTs, and PTc in this device is described below. The figure formed of a horizontal axis 520 and a vertical axis 521, shown arranged to the right of this device of FIG. 5, represents the relationship of the array pitch P(x) corresponding to the x coordinate position of this device, that is, a dimension comparison characteristic line 522 of PR, PTs, and PTc. The dimensional lengths PR, PTs, and PTc are constant in each region, and therefore, P(x) is represented as a stepwise function. Therefore, regarding the line width L of the interdigital transducer, when the ratio LT/ST of the dimensions is constant in all the three regions of the IDT, each line width L of the interdigital transducer takes a fixed value, excluding processing variations, within each region. Furthermore, in a special case, since the line width ratio PTc/PTs is close to 1, the line width L can also be made constant in the three regions. The line width L of the IDT is often set to a value such that the reflection coefficient rate b per electrode becomes a maximum. Regarding the in-plane rotated ST-cut quartz-crystal plate of FIG. 13, the ratio LT/ST is in the range 0.42 to 0.67 for the entire IDT and the reflectors. One quarter of the wavelength λ of the surface acoustic wave and the film thickness H are also set to constant values in a similar manner, excluding processing variations.

More specifically, the dimensions of the array pitches PTs and PTc of the interdigital transducer (IDT), and the array pitch PR of the reflectors are set to satisfy the relation PR>PTs>PTc. The ratio PTc/PTs is in the range 0.985 to 0.996. The ratio PR/PTs is in the range 1.0 to 1.01. The number of pairs in the interdigital transducer arranged in the center is denoted as Mc, and Mc/M, which is the ratio thereof to the total number of pairs M, is in the range 0.1 to 0.6. The basis of these formation conditions is shown in a characteristic view (described below).

The capability/incapability of processing for the range in which "the line width ratio PTc/PTs is 0.985 to 0.996", which is a factor for determining the implementability of the present invention, will be mentioned. There is a relation PTc, PTs=Vs/(2f) between the device frequency f (MHz) and the dimensions PTc and PTs (μm), where the velocity Vs of the surface acoustic wave used is 3100 m/s. It is clear that the present invention is advantageous in terms of processing, in particular, for low frequencies. However, it is also a fact that miniaturization becomes difficult, in particular, for low frequencies. In one example, if f=200 MHz, PTs becomes 7.750 μm and PTc becomes 7.711 μm by assuming that PTc is 0.995 of PTs. The difference between them is 0.039 μm. When this processing accuracy resolution is converted into mask accuracy used for a projector capable of reduction exposure to ⅕, it becomes 0.195 μm, which is large enough with respect to the current resolution 0.01 μm of electron beam exposure units and can thus be realized. If the number of pairs Mc in the IDT region of the dimension PTc is 20, the mask dimension difference, which is five times as great as that of the corresponding region, is 0.039×20×2×5=7.8 μm, and this can be sufficiently measured and identified.

If the formation conditions are specified in further detail, these may be stated as follows. The interdigital transducer and the reflectors are formed of aluminum metal, the interdigital transducer is formed of M pairs by assuming positive and negative electrodes to be one pair, the reflectors are formed of N electrode conductors, the total M+N is in the range 180 to 250, the number of pairs M in the interdigital transducer is in the range 95 to 140, the reflection coefficient γ of the surface acoustic wave per electrode is in the range 0.005 to 0.015, the total reflection coefficient Γ possessed by the entire interdigital transducer is 1.8>Γ>0.25, the closest distance between parallel conductors between the reflectors and the interdigital transducer is formed by a space ST from among the line LT and the space ST possessed by one pitch of the interdigital transducer, the dimensions of the array pitch PTs of the interdigital transducer arranged on both sides, the array pitch PTc of the interdigital transducer arranged in the center, and the array pitch PR of the reflectors are set to satisfy the relation PR>PTs>PTc, the ratio PTc/PTs is in the range 0.985 to 0.996, PR/PTs is in the range 1.0 to 1.01, and Mc/M, which is the ratio of the number of pairs in the interdigital transducer arranged in the center, which is denoted as Mc, to the total number of pairs M, is in the range 0.1 to 0.6. Once more, as a condition for the piezoelectric plate, a rotated ST-cut quartz-crystal plate is used in which a quartz-crystal rotated Y plate is rotated by a rotational angle θ=31 to 42 degrees in a counterclockwise direction about the electrical axis (X axis), and the propagation direction x of the surface acoustic wave is rotated in-plane in a range of 40 to 46 degrees from the electrical axis (X axis).

A short description is provided below. In the ST cut plate, the range of the total reflection coefficient which forms a satisfactory SAW resonator, described in equation (1) described above, is 10>θ>0.8. Since the minimum M is 80 pairs, the reflection coefficient γ of the surface acoustic wave per electrode is regarded as γ=Γ/M=0.8/80=0.01 (1%). Furthermore, in the ST cut plate, the fact that the total M+N=200 is the minimum device size, is known empirically. Therefore, in the related art technology using a rotated ST-cut quartz-crystal plate (R-ST substrate), since the reflection coefficient γ becomes approximately half, when the total M+N is 400 or if the configuration is formed as M+N is 200, the Q value becomes 6000, which is half, or R1 becomes 32 Ω, which is double. In contrast, according to the present invention, even when the range of the reflection coefficient γ of the R-ST substrate is assumed to be 0.005 to 0.015, if the reflection coefficient γ is 0.005, which is half, satisfactory characteristics can be obtained in a range in which the total M+N is 180 to 250 and the number of pairs M is 95 to 140 (corresponds to the case of ETA=0.5 in the curve 1104 of FIG. 11). At this time, the total reflection coefficient Γ possessed by the IDT takes a range of 0.005×95=0.475 to 0.015×140=2.1.

Figure 1:
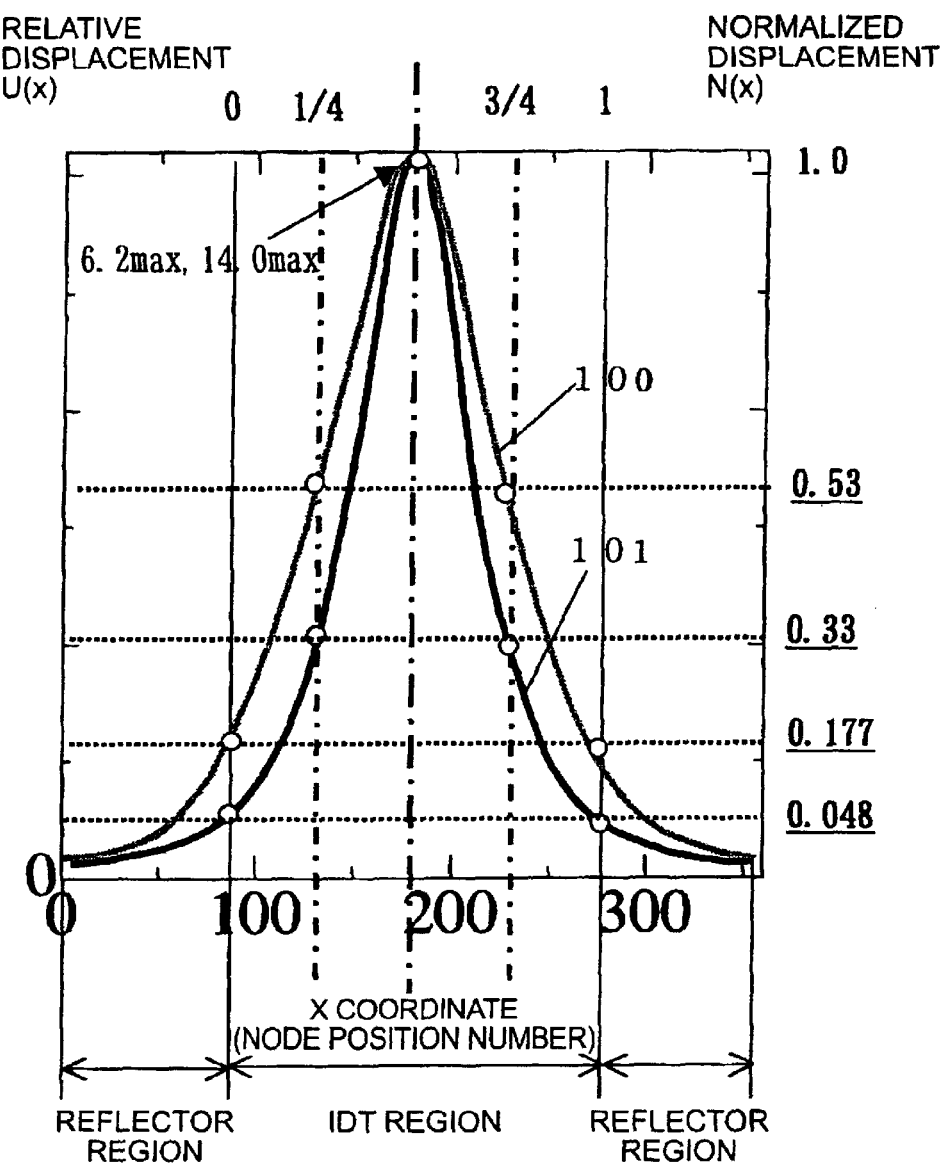
FIG. 1 is a graph that shows a vibration displacement possessed by an exemplary embodiment of a surface acoustic wave resonator of the present invention.

Next, in FIG. 1, the form of the vibration displacement which characteristically specifies the basis of the present invention, obtained by using the configuration of FIG. 5 as an example, is shown.

Figure 2:
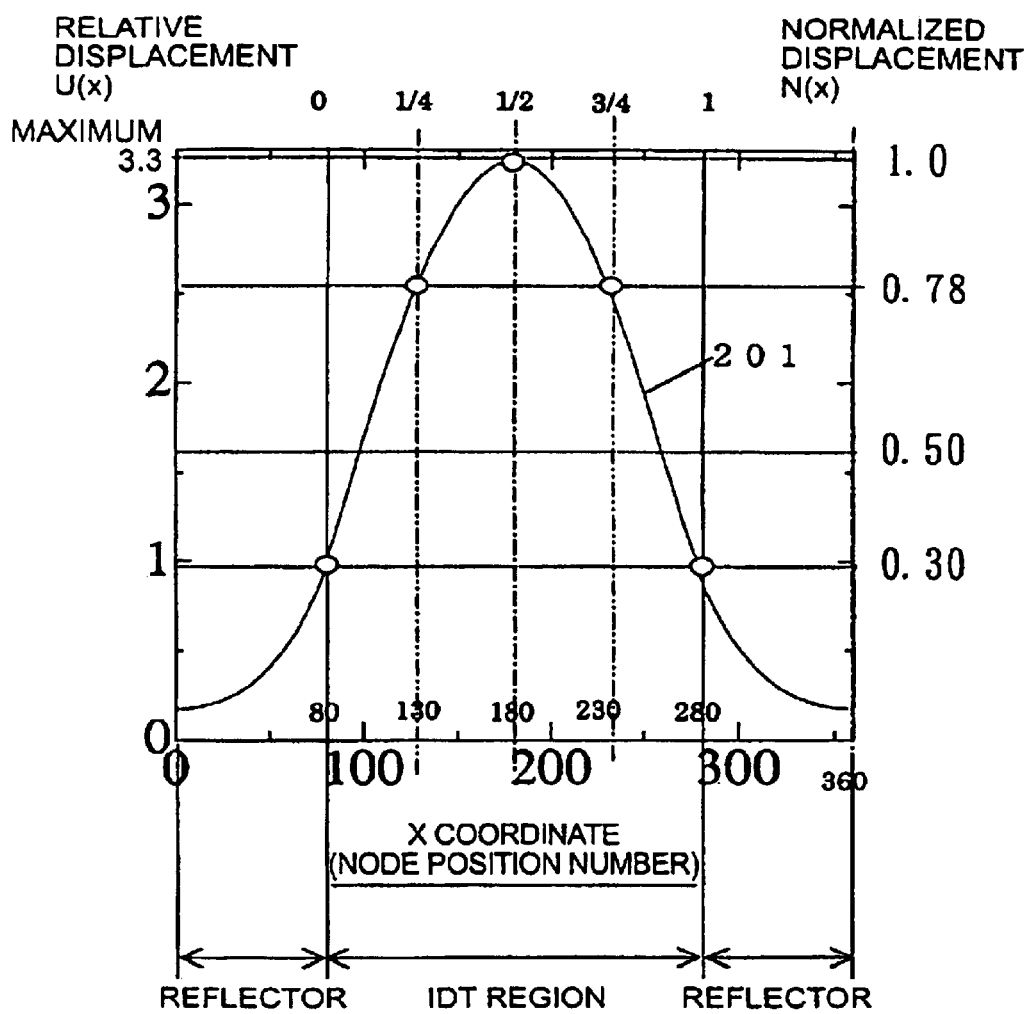
FIG. 2 is a graph that shows a vibration displacement possessed by an example of a related art surface acoustic wave resonator.

FIG. 1 is a displacement diagram in which the state of a vibration displacement is calculated similarly to FIG. 2 of the related art case by a related art calculation method. The calculation method is described below. By denoting the variable of device states as W, a combination of W={right traveling wave R(x), left traveling wave L(x), voltage V, electric current I(x)} is taken. This is convenient because the vibration displacement is directly determined when compared to the related art ordinary equivalent circuit method. The vibration displacement refers to an envelope amplitude U(x) {=R(x)+L(x)} such that the maximum values of the vibration displacements which steadily vibrate periodically with time are connected (curves 100 and 101 in FIG. 1). The horizontal axis in FIG. 1 shows the position coordinate of the center position (node) of the line width LR or LT formed by one electrode of the SAW resonator formed of two reflectors on both sides and the IDT. The left side of the vertical axis shows the relative value of the U(x), and N(x) on the right side is the value of N(x)=U(x)/Umax, which is obtained by normalizing the U(x) by Umax, which is the maximum value which can be taken by the U(x). In the range in which the ratio PTc/PTs is 0.985 to 0.996, Umax is a value of 6.2 (in the case of PTc/PTs=0.996 of the curve 100) to 14.0 (in the case of PTc/PTs=0.985 of the curve 101). The coordinate of 0 to 1, shown in the upper portion of FIG. 1, is a coordinate value in which the position coordinate of the IDT is normalized across the total length of the IDT, with one of the ends being set at 0 and the other end being set at 1.

In the present invention, the normalized amplitude N(x) is N(x)=1 at ½ of the total length, which is the center position of the IDT region of the whole, is 0.33 to 0.53 at ¼ and ¾ thereof, and takes a value of 0.048 to 0.177 at both ends 0 and 1 of the IDT. Thus, it can be seen that the normalized amplitude N(x) takes a smooth function in which the displacement in the center is considerably larger than the N0(x), which is of the related art standard-type, that is, energy is concentrated in the center.

Figure 3A:
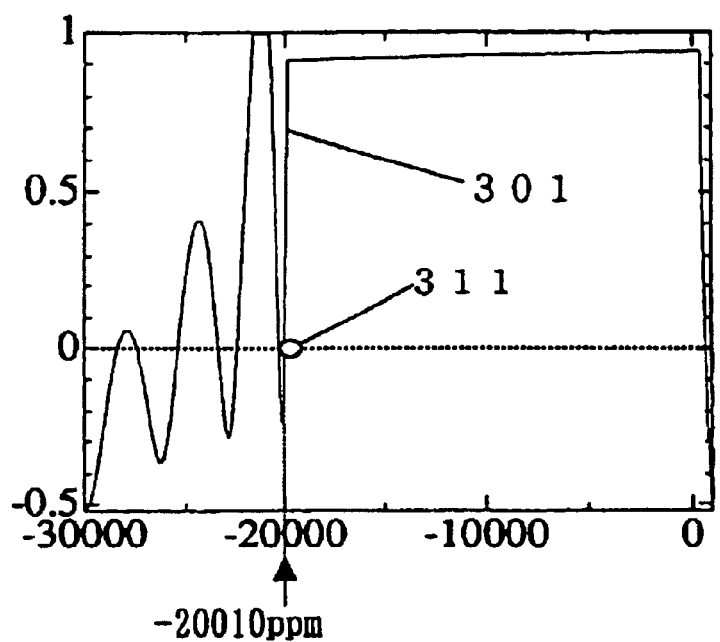
FIGS. 3A and 3B are root locus charts, where
Figure 3B:
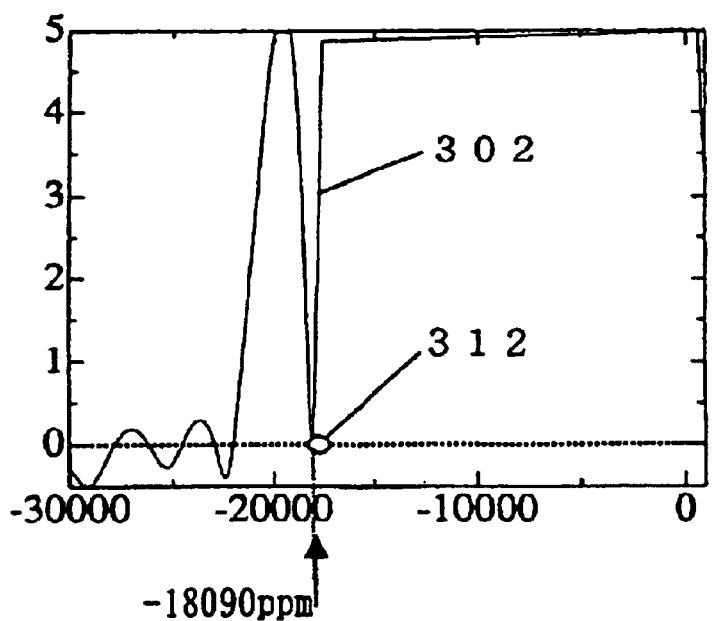

FIGS. 3A and 3B are schematics which provide the relation of an error $\epsilon$ of a frequency versus related art equation in a conditional equation which provides a resonance frequency solution of the SAW resonator (the conditional equation is omitted for simplicity of description.) The case of a related art product is a curve 301 of FIG. 3A, and the case of the present invention of FIGS. 1 and 5 is a curve 302 of FIG. 3B. The horizontal axis shows the frequency, which is shown by the frequency change rate df/f (ppm units). The vertical axis shows an error $\epsilon$ of a conditional equation which provides the root, and $\epsilon=0$ provides a resonance frequency point. It can be seen that the main resonance frequency in the present invention changes characteristically from the related art −20010 ppm (point 311 of FIG. 3A) to −18090 ppm in the upper portion (point 312 of FIG. 3B).

Figure 4:
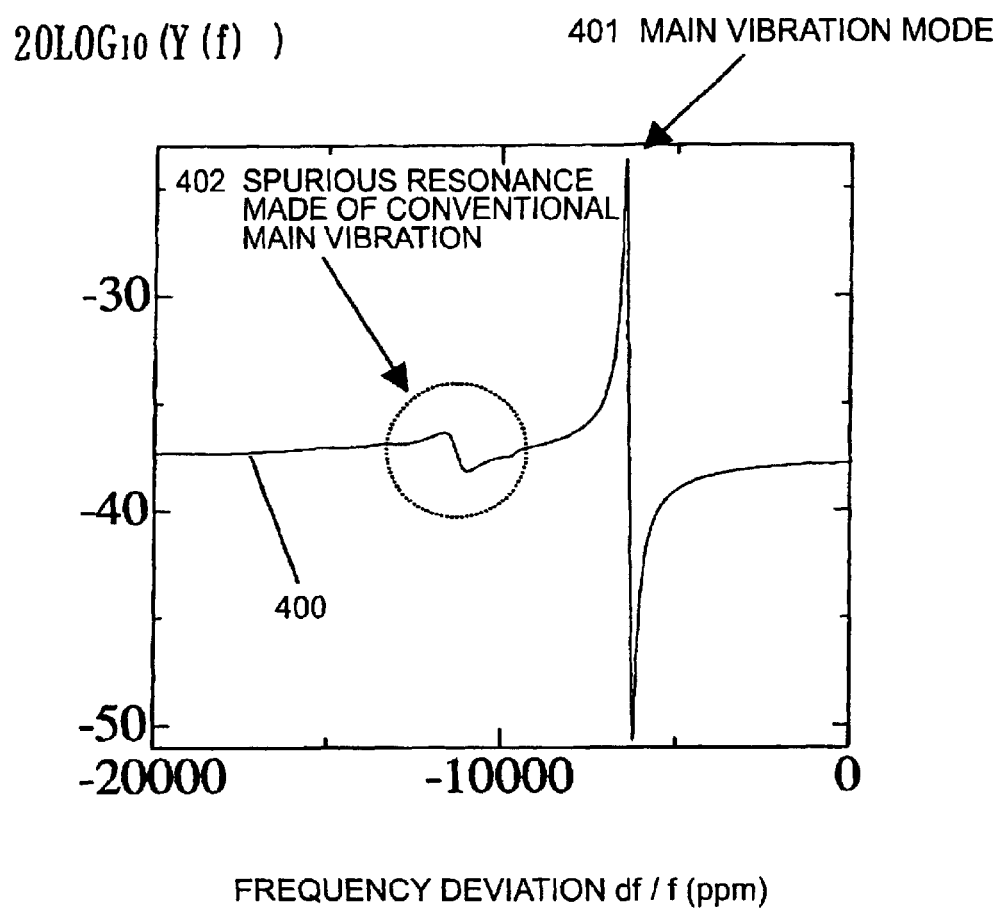
FIG. 4 is a graph showing the frequency characteristics of Y(f) possessed by the SAW resonator of the present invention.

Furthermore, as a basis such that the SAW resonator of the present invention differs from a related art one, the frequency characteristics (resonance characteristics) of the admittance Y(f) possessed by the SAW resonator of the present invention are shown in FIG. 4 (curve 400). The horizontal axis of FIG. 4 shows the frequency, which is a frequency change rate df/f (ppm units). The vertical axis shows a logarithmic display (20 LOG10Y(f)) of the admittance Y(f) of the SAW resonator. A resonance 402 whose amplitude is small, which exists from the lower portions 4000 to 5000 ppm in the main vibration mode, corresponds to a related art main vibration mode, and here, this is spurious resonance.

The characteristics provided by the formation conditions of FIGS. 1 and 5 in the present invention are described below.

Figure 6:
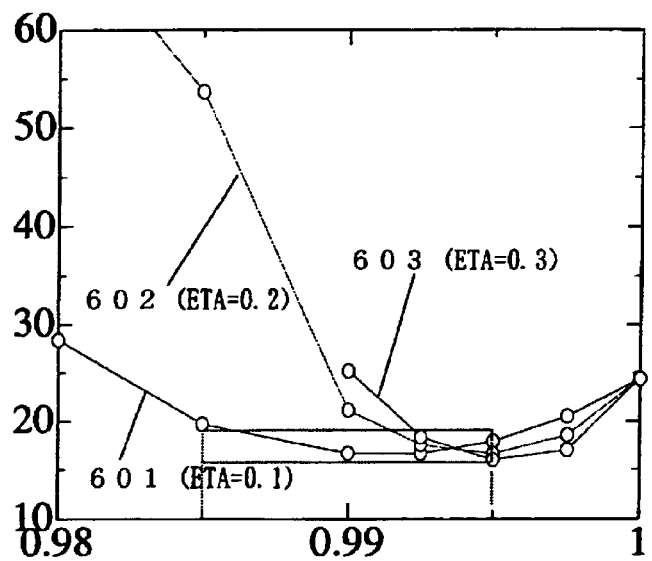
FIG. 6 is a graph showing PTNG versus R1 characteristics possessed by the SAW resonator of the present invention.

In FIG. 6, the ratio PTc/PTs, which is the line width ratio of the electrodes, is shown as PTNG in the horizontal axis, and the equivalent series resistance R1 of the SAW resonator is shown in the vertical axis. In FIG. 6, ETA in parentheses indicates the ratio Mc/M of the number of pairs in the interdigital transducer arranged in the center, which is denoted as Mc, to the total number of pairs M. A curve 601 in FIG. 6 shows the case of ETA=0.1, a curve 602 shows the case of ETA=0.2, and a curve 603 shows the case of ETA=0.3. In the range in which the ratio Mc/M is 0.1 to 0.3, it can be seen that an almost minimum R1 is taken in the range in which PTNG=PTc/PTs is 0.985 to 0.995 (within the broken-line frame).

In FIG. 6, the line width ratio PTNG=1 of the electrodes is a related art design condition, and provides R1 =approximately 25 ($\Omega$). In contrast, in the present invention, in the range in which PTNG=PTc/PTs is 0.985 to 0.995, and in the range in which PTNG=PTc/PTs is 0.995±0.001, which is limited further, an almost minimum R1 (16$\Omega$) is taken. Thus, it was found for the first time that the CI value can be greatly enhanced.

Figure 7:
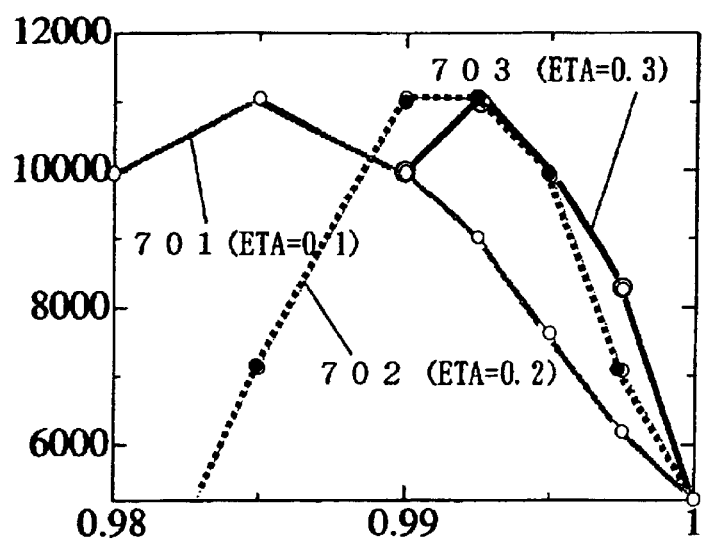
FIG. 7 is a graph showing a PTNG versus Q value relationship possessed by the SAW resonator of the present invention.

FIG. 7 shows the relation of the Q value (vertical axis) of the SAW resonator of the present invention versus the line width ratio PTNG (horizontal axis). A curve 701 indicates the case of ETA=0.1, a curve 702 indicates the case of ETA=0.2, and a curve 703 indicates the case of ETA=0.3. It can be seen that, with respect to the range in which ETA is 0.1 to 0.3, PTNG which provides the maximum Q value with respect to each ETA exists in the range 0.985 to 0.995. As ETA increases, PTNG which provides the maximum Q value or the minimum R1 increases. It is confirmed by calculations that PTNG=0.995 provides a satisfactory characteristic level with respect to the range in which ETA is 0.1 to 0.6.

Figure 8:
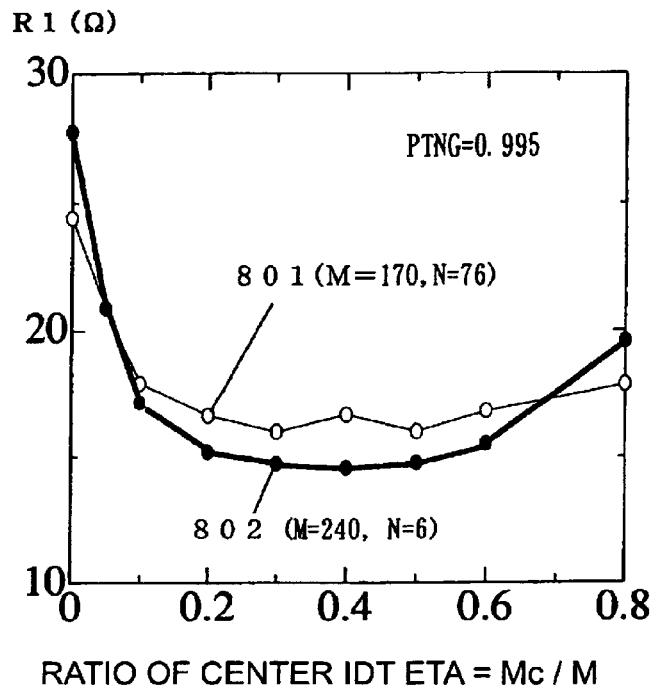
FIG. 8 is a graph showing an ETA versus R1 relationship possessed by the SAW resonator of the present invention.

FIG. 8 shows the relation of the equivalent series resistance R1 ($\Omega$) (vertical axis) of the SAW resonator of the present invention versus ETA=Mc/M (horizontal axis), which is the ratio of the center IDT. A curve 801 indicates the case in which the total number of pairs M in the IDT is 170 and the number of conductors N of the reflector is 76. A curve 802 indicates the case in which the total number of pairs in the IDT is 240 and the number of conductors N of the reflector is 6. In spite of the fact that the ratio of M/(M+N) is greatly varied from 0.69 to 0.97, it can be seen that R1 is almost flat and shows satisfactory 16 $\Omega$ with respect to the range in which ETA is 0.1 to 0.6 (in the related art technology, a level of 32 $\Omega$ is taken on average). However, in this case, PTNG is set to 0.995, but similar tendency is also shown in another range of 0.985 to 0.996.

Figure 9:
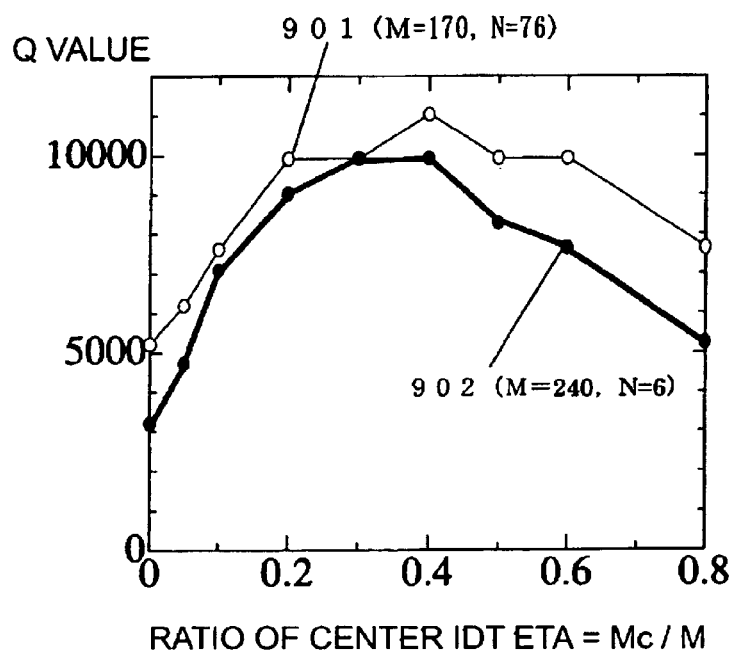
FIG. 9 is a graph showing an ETA versus Q value relationship possessed by the SAW resonator of the present invention.

FIG. 9 shows the relation of the Q value (vertical axis) of the SAW resonator of the present invention versus ETA= Mc/M (horizontal axis), which is a ratio of the center IDT. A curve 901 indicates the case in which the total number of pairs M in the IDT is 170 and the number of conductors N of the reflector is 76. A curve 902 indicates the case in which the total number of pairs M in the IDT is 240 and the number of conductors N of the reflector is 6. In spite of the fact that the ratio M/(M+N) is varied greatly from 0.69 to 0.97, it can be seen that the Q value is almost flat and shows satisfactory 10000 with respect to the range in which ETA is 0.2 to 0.6 (in the related art technology, a level of 6000 is taken on average). However, in this case, PTNG is set to 0.995, but similar tendency is also shown in another range of 0.985 to 0.996.

Figure 10:
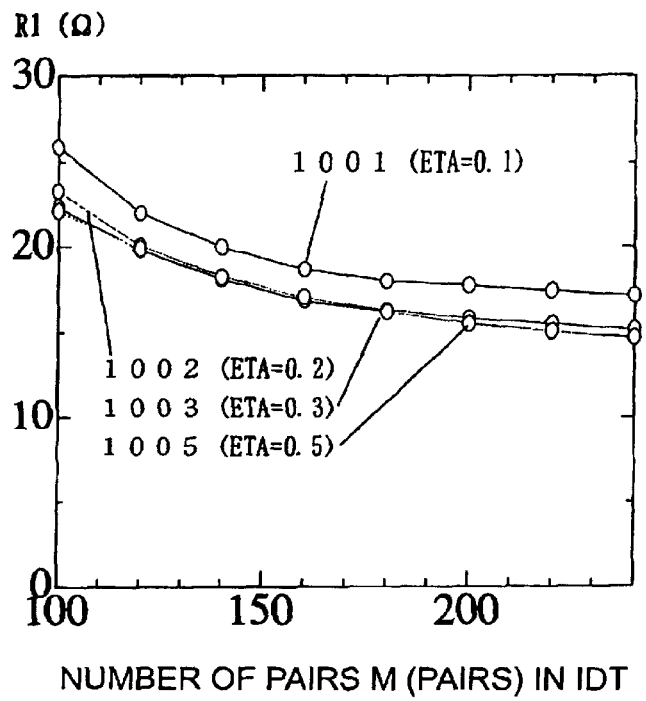
FIG. 10 is a graph showing an M versus R1 relationship possessed by the SAW resonator of the present invention.

FIG. 10 shows the relation of the equivalent series resistance R1 ($\Omega$) (vertical axis) of the SAW resonator of the present invention versus the total number of pairs M (horizontal axis) in the IDT. A curve 1001 shows the case of ETA=0.1, a curve 1002 shows the case of ETA=0.2, a curve 1003 shows the case of ETA=0.3, and a curve 1005 shows the case of ETA=0.5. It can be seen that, in a range in which ETA is 0.2 to 0.5, an almost same level of the value R1 is taken, and as M increases, a tendency to decrease moderately is shown. However, PTNG is set in a range of 0.985 to 0.996.

Figure 11:
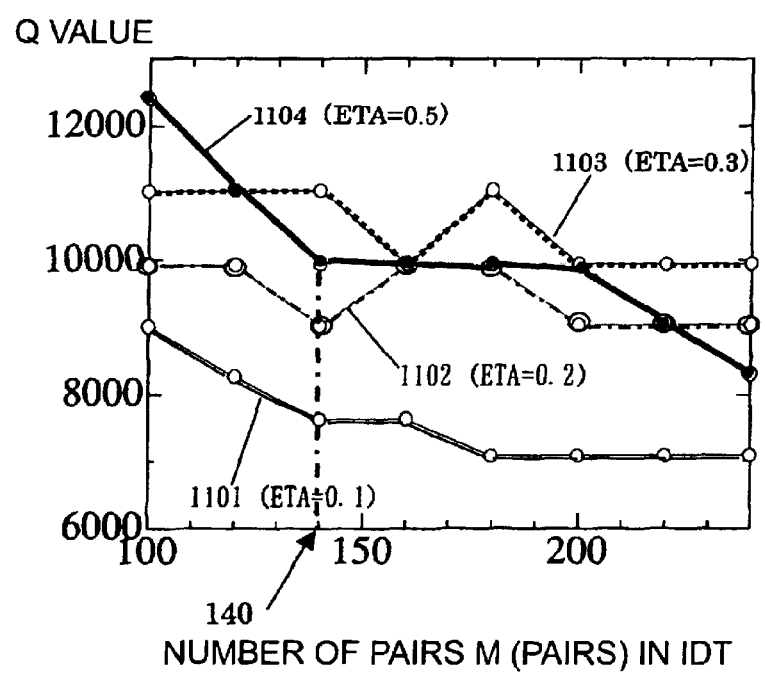
FIG. 11 is a graph showing an M versus Q value relationship possessed by the SAW resonator of the present invention.

FIG. 11 shows the relation of the Q value (vertical axis) of the SAW resonator of the present invention versus the total number of pairs M (horizontal axis) in the IDT. A curve 1101 shows the case of ETA=0.1, a curve 1102 shows the case of ETA=0.2, a curve 1303 shows the case of ETA=0.3, and a curve 1104 shows the case of ETA=0.5. It can be seen that, in a range in which ETA is 0.2 to 0.5, an almost same level of the value Q=10000 is taken, and as M increases, a tendency to decrease moderately is shown. In particular, when M=100, N=140, and ETA=0.5, Q=12500, which is larger than ever, is obtained. However, PTNG is set in a range of 0.985 to 0.995.

Figure 12:
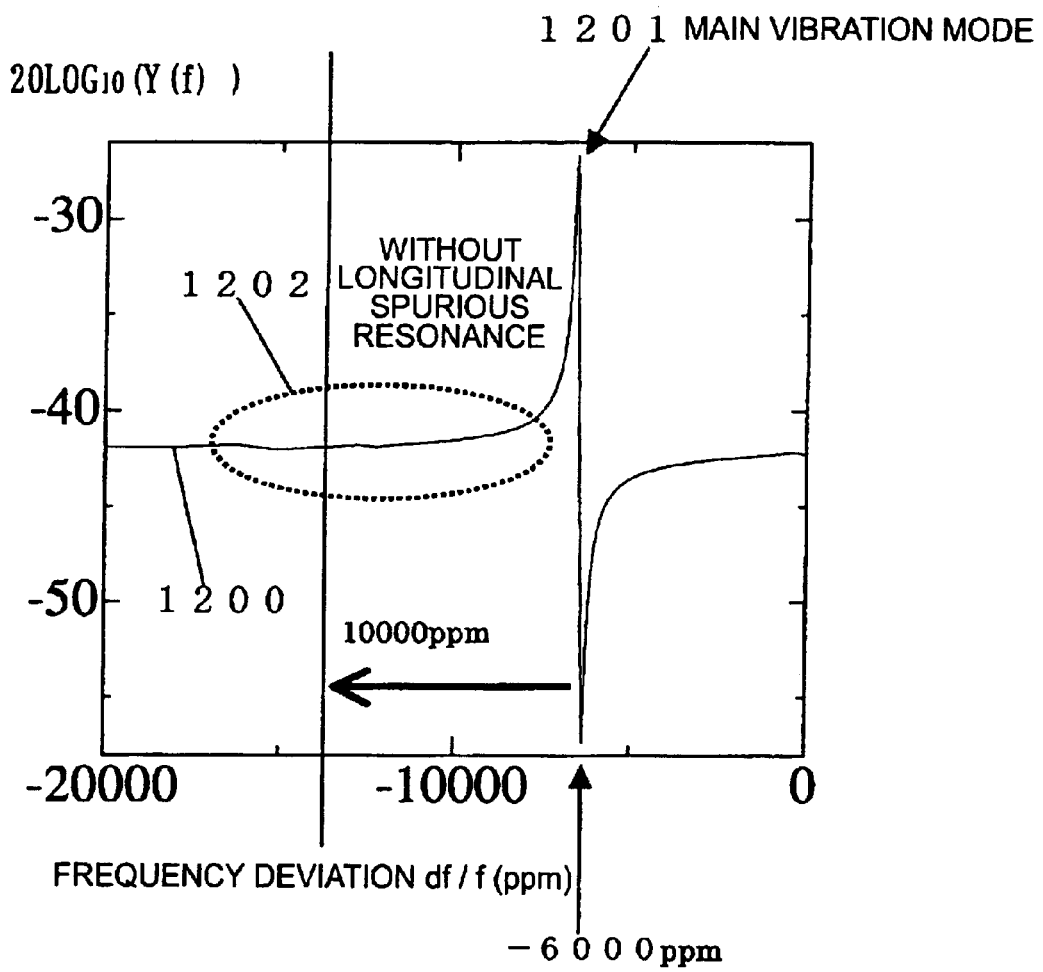
FIG. 12 is a graph showing other frequency characteristics of Y(f) possessed by the SAW resonator of the present invention.

FIG. 12 shows the frequency characteristics (resonance characteristics) of the admittance Y(f) possessed by the SAW resonator, in particular, in the case of the condition in which spurious resonance does not exist, in the present invention (curve 1200). The horizontal axis of FIG. 12 shows the frequency, which is shown by a frequency change rate df/f (ppm units). The vertical axis shows a logarithmic display (20 LOG10Y(f)) of the admittance Y(f) of the SAW resonator. It can be seen that spurious resonance does not exist within an region 1202 of the lower portion 10000 ppm of −6000 ppm, which is the main vibration mode 1201. The formation conditions of the present invention to realize this characteristic are: M=100±5, N=180 to 240, PTNG= 0.995±0.001, ETA=0.5±0.005, and the electrode finger crosswidth=48 wavelengths. The Q value of the SAW resonator at a frequency 312 MHz in this case is 12400, R1 is 22 Ω, C1=1.84 fF, C0=3.84 pF, the capacitance ratio C0/C1 is 2086. The reason why R1 becomes a comparatively large value as 22 Ω is that C1 decreases.

As described above, the configuration and the characteristics of a surface acoustic wave resonator using Rayleigh-type and STW-type surface acoustic waves are described with regard to a substrate formed of only quartz crystal in the present invention. Even if the substrate is other than quartz crystal, and even if a thin film such as SiO2, ZnO, etc., is formed on the surface of the substrate to such a degree as not deteriorate the characteristics of this device, a mention is added that this is effective as long as the formation conditions of the present invention are satisfied.

What is claimed is:

1. A surface acoustic wave resonator, comprising:

a piezoelectric plate;

an interdigital transducer to excite a surface acoustic wave in a propagation direction x on the piezoelectric plate; and a pair of reflectors arranged on both sides of the interdigital transducer in a propagation direction;

the interdigital transducer being divided into three regions and including electrode fingers, the electrode fingers of the interdigital transducer of each region being formed at a fixed pitch which varies within 2%, the surface acoustic wave resonator possessing a single peak response, a form in which a vibration displacement envelope amplitude in the interdigital transducer region is normalized by its maximum value being a form which takes a maximum value 1 at a center position of the interdigital transducer region, which smoothly takes a value in a range of 0.33 to 0.53 at a position of ¼ of the total length of the interdigital transducer region from both ends thereof, and which smoothly takes a value in a range of 0.048 to 0.177 at positions at both ends of the interdigital transducer region.

2. The surface acoustic wave resonator according to claim 1, regarding the array pitch of the interdigital transducer which is divided into three regions, the dimensions of the array pitch PTs of the interdigital transducer regions arranged on both sides, the array pitch PTc of the interdigital transducer region arranged in the center, and the array pitch PR of the reflectors are set to satisfy the relation PR>PTs>PTc, the ratio PTc/PTs being in the range 0.985 to 0.996, and PR/PTs being in the range 1.0 to 1.01, and Mc/M, which is a ratio of the number of pairs Mc of electrode fingers of the interdigital transducer region arranged in the center to the number of pairs M of electrode fingers of the whole interdigital transducer, being in the range 0.1 to 0.6.

3. The surface acoustic wave resonator according to claim 1, the interdigital transducer and the reflectors being formed of aluminum metal, the interdigital transducer being formed of M pairs of electrode fingers by assuming positive and negative electrodes to be one pair, the reflectors are formed of N electrode conductors, the total M+N being in the range 180 to 250, and the number of pairs M of the interdigital transducer being in the range 95 to 140, the reflection coefficient γ of the surface acoustic wave per the electrode being in the range 0.005 to 0.015, and the total reflection coefficient Γ possessed by the entire interdigital transducer being 1.8>Γ>0.25, the closest distance between parallel conductors between the reflectors and the interdigital transducer regions being formed by a space from among the line and the space possessed by one pitch of the interdigital transducer region, the dimensions of the array pitch PTs of the interdigital transducer arranged on both sides, the array pitch PTc of the interdigital transducer arranged in the center, and the array pitch PR of the reflector being set to satisfy the relation PR>PTs>PTc, the ratio PTc/PTs being in the range 0.985 to 0.996, PR/PTs being in the range 1.0 to 1.01, and Mc/M, which is a ratio of the number of pairs Mc of electrode fingers of the interdigital transducer region arranged in the center to the total number of pairs M of electrode fingers, being in the range 0.1 to 0.6.

4. The surface acoustic wave resonator according to claim 3, the total number of pairs M of electrode fingers of the interdigital transducer being 100±5, the number of electrode conductors N of the reflector being in the range 80 to 140, the ratio PTc/PTs being in the range 0.995±0.001, and Mc/M, which is the ratio of the number of pairs Mc of electrode fingers of the interdigital transducer region arranged in the center to the total number of pairs M of electrode fingers of the interdigital transducer, being 0.5±0.05.

5. The surface acoustic wave resonator according to claim 1, the piezoelectric plate being a rotated ST-cut quartz-crystal plate in which a quartz-crystal rotated Y plate is rotated by a rotational angle θ=31 to 42 degrees in a counterclockwise direction about the electrical axis (X axis), and the propagation direction x of the surface acoustic wave being rotated in-plane in a range of 40 to 46 degrees from the electrical axis (X axis).

* * * * *